United States Patent [19]

Tsumori et al.

[11] Patent Number: 5,593,799
[45] Date of Patent: Jan. 14, 1997

[54] EXPOSURE MASK

[75] Inventors: Toshiro Tsumori; Hideo Shimizu, both of Kanagawa, Japan

[73] Assignee: Sony Corporation, Tokyo, Japan

[21] Appl. No.: 603,943

[22] Filed: Oct. 26, 1990

[30] Foreign Application Priority Data

Oct. 27, 1989 [JP] Japan ................................. 1-280249

[51] Int. Cl.$^6$ ....................................... G03F 9/00
[52] U.S. Cl. ................... 430/5; 430/311; 430/396
[58] Field of Search ....................... 430/5, 22, 269, 430/311, 396

[56] References Cited

U.S. PATENT DOCUMENTS 5,045,417  9/1991  Okamoto ................................. 430/5
5,489,509  4/1990  Kawabata et al. ........................ 430/5

FOREIGN PATENT DOCUMENTS 0090924  12/1983  European Pat. Off. .

OTHER PUBLICATIONS

Improving Resolution in Photolithography w̄ a Phase–Shift Mask, IEEE Transactions on Electron Devices, vol. ED–29, No.–12, Dec. 1982.

Primary Examiner—S. Rosasco
Attorney, Agent, or Firm—Hill, Steadman & Simpson, A Professional Corporation

[57] ABSTRACT

An exposure mask having phase shifting films of a predetermined thickness composed of a material transparent to the wavelength of exposure light and formed on a substrate transparent to such wavelength for causing a desired phase shift, wherein the phase shifting films are so patterned as to principally have arrangement of repeated patterns. Relative to the rule width L of the repeated patterns projected onto a work member to be exposed, a pattern having a rule width of 2 L/m is formed, in which m ($\leq 1$) is a size reduction magnification in the use of a reduced-size projection exposer. The exposure mask is adapted for use in producing a diffraction grating as well. The mask is easily manufacturable without the necessity of any intricate process such as a positioned exposure, hence minimizing the number of required steps in manufacture while achieving a further fine work with an enhanced resolution higher than the known value.

9 Claims, 12 Drawing Sheets 2.5μm (Embodiment)

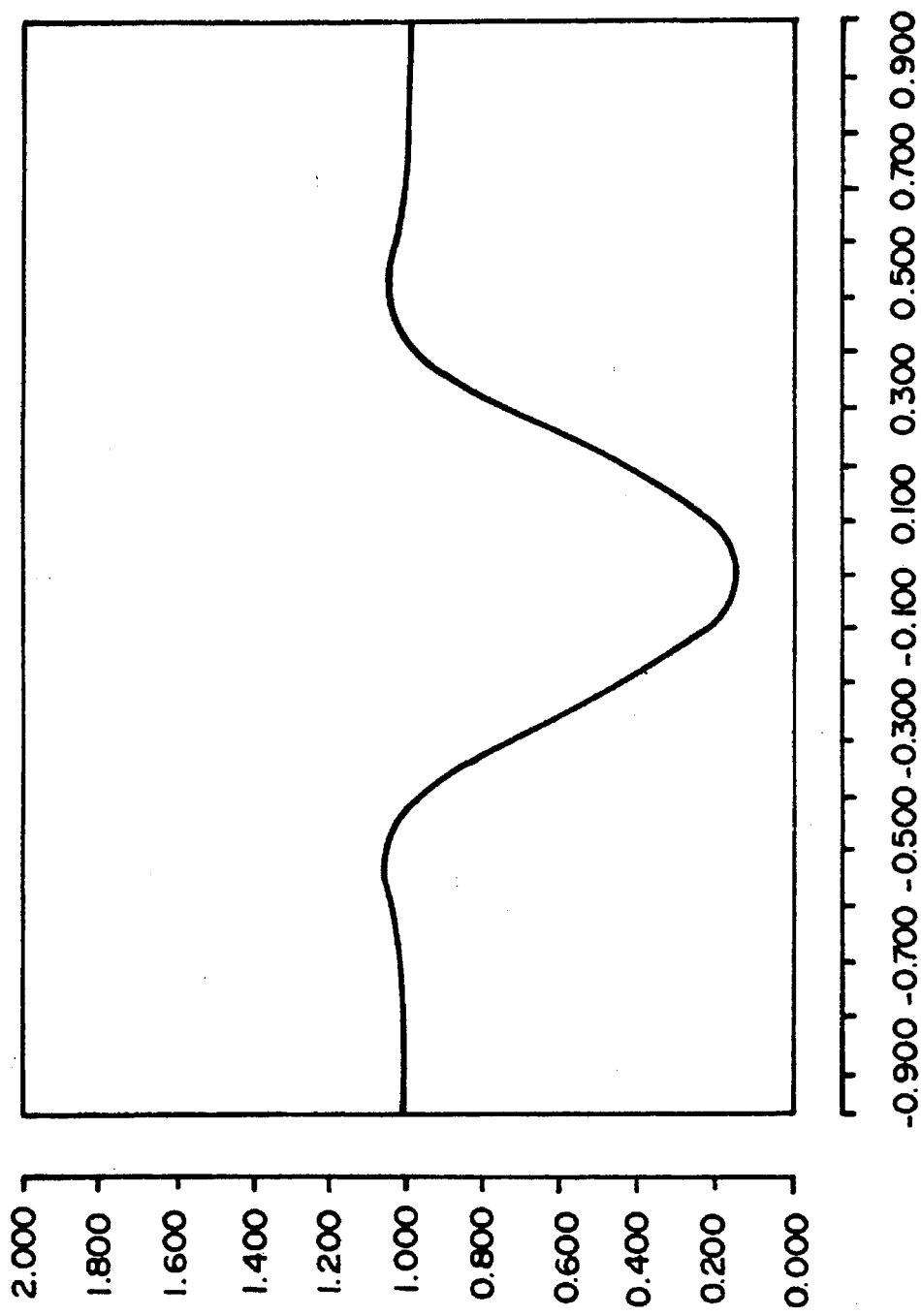

EXPOSURE MASK

BACKGROUND OF THE INVENTION

1. Field of the Invention

The present invention relates to an exposure mask which is utilizable for forming a desired pattern by an exposure in manufacture of an electronic component such as a semiconductor device.

2. Description of the Prior Art

In the technical field to execute an exposure by the use of an exposure mask, the processing dimensions tend to be further finer year after year. For example, in the use of an exposure mask for forming a desired pattern in manufacture of a semiconductor device, the patterning based on such exposure is required to be dimensionally more minute in conformity with miniaturization of the device to be manufactured.

In an exemplary case of a semiconductor integrated circuit, the required processing dimensions are gradually miniaturized from year to year and, in the latest technical developments and studies, the dimensional requisite is fundamentally smaller than 0.5 micron. For realizing such extremely fine work, some designs are in progress to attain a higher numerical aperture and a shorter wavelength with regard to an exposer as well as to obtain an improved resist material, and considerable effects have been achieved. In such technical circumstances, some attempts are currently carried out to accomplish extremely fine work beyond the threshold resolution by devising an improved exposure mask (reticle) employed for pattern transfer. Of such technical development, a phase shifting method is now attracting particular attention (as disclosed in Japanese Patent Laid-open No. 58 (1983)-173744; and Marc D. Levenson et al., "Improving Resolution in Photolithography on Electron Devices", Vol. ED-29, No. 12, December 1982, pp. 1828–1836).

The conventional phase shifting method known heretofore will now be described below with reference to FIGS. 2 and 3. Here, an explanation of the above technique will be given with regard to an exemplary case of forming a line-and-space pattern. In an ordinary mask, as shown in FIG. 3 (a), light shielding portions 2 are formed by the use of a light shielding material such as chromium on a transparent substrate 1 of quartz or the like, and an arrangement of repeated line-and-space patterns is formed to produce an exposure mask. The intensity distribution of the light transmitted through such exposure mask is represented by a curve A1 in FIG. 3 (a), wherein the intensity is zero in the light shielding portion 2 while the light is transmitted through the other portions (light transmitting portions 21, 22). Viewing one light transmitting portion 21 as an example, the intensity of the light transmitted therethrough and irradiated to a work member to be exposed is so distributed as represented by a curve A2 in FIG. 3 (a), wherein hill-like maximums are existent at the feet on both sides due to the diffraction of the light and so forth. The light passed through the light transmitting portion 22 is represented by a one-dot chain line. When the light rays obtained through the individual transmitting portions 21, 22 are mutually combined, the light intensity distribution is deprived of its sharpness as indicated by a curve A3 to consequently blur the image due to diffraction of the light, hence a sharp exposure fails to be provided. In contrast therewith, if the phase shifting films 3 are provided on the light shielding portions 21, 22 of the repeated patterns either alternately as shown in FIG. 3 (b) or in a manner illustrated in FIG. 2, any blur of the image resulting from diffraction of the light is eliminated by inversion of the phase to eventually achieve transfer of a sharp image, thereby improving the resolution and the focusing allowance. More specifically, when a phase shifting film 3 is formed on one light transmitting portion 21 as shown in FIG. 3 (b) in such a manner as to cause a phase shift of 180° for example, the light passed through the phase shifting film 3 is inverted as represented by a curve B1. Meanwhile the light obtained through the adjacent light transmitting portion 22 is not passed through the phase shifting film 3, so that none of such phase inversion is induced. Therefore, on the work member to be exposed, the mutually phase-inverted light rays cancel each other in the position B2 at the foot of the light intensity distribution, whereby the distribution of the light irradiated to the work member is rendered ideally sharp as represented by a curve B3 in FIG. 3 (b).

In the example mentioned, the greatest advantage is attainable by causing a 180° inversion of the phase to ensure the above-described effect. However, for realizing such a satisfactory result, it is necessary for the phase shifting film to have a sufficient thickness $$d = \frac{\lambda}{2(n-1)}$$

(where n denotes the refractive index of the phase shifting film, and λ denotes the wavelength of the exposure light).

In the process of forming a pattern by an exposure, it is customary that a member used for reduced-size projection is termed a reticle, and a member for life-size projection is termed a mask; or a member corresponding to an original sheet is termed a reticle, and a member obtained by duplicating such a reticle is termed a mask. In the present invention, any of the masks and reticles classified by such various definitions is termed a mask in general.

In the phase shifting exposure mask mentioned above, there is the necessity of forming both a light shielding portion 2 and a phase shifting portion 3, and moreover exact mutual positioning is required in the step of forming them, whereby some complication is unavoidable in manufacture of the exposure mask. Namely, in the conventional technique, there is needed a complicated process of executing a second positioned EB (electron beam) exposure for the mask where a light shielding portion has already been formed by a first EB exposure and etching. For this purpose, a positioning mark must be previously formed at the time of the first EB exposure, thereby inducing intricacy in the mask manufacturing process.

OBJECTS AND SUMMARY OF THE INVENTION

The present invention has been accomplished in an attempt to solve the above-described problems existing in the conventional phase shifting exposure mask. And its object resides in providing an improved exposure mask which is producible without the necessity of any complicated process such as a positioned exposure and is still capable of fully utilizing the phase shifting exposure technique that ensures a high resolution and an extremely fine work.

The exposure mask of the present invention has phase shifting films of a predetermined thickness composed of a material transparent to the wavelength of exposure light and formed on a substrate transparent to such wavelength so as to cause a desired phase shift. Utilizing the phenomenon that the intensity of the light irradiated to a work member to be exposed is diminished to zero or a value approximate thereto in the vicinity of the edge of the phase shifting film, an exposure for forming a desired pattern can be performed without the necessity of any light shielding member in particular.

According to one aspect of the present invention, there is provided an exposure mask wherein the phase shifting films thereof are so patterned as to have an arrangement of principally repeated patterns.

According to another aspect of the invention, there is provided an exposure mask wherein, relative to the rule width L of the repeated patterns projected onto a work member to be exposed, a pattern having a rule width of 2 L/m is formed, in which m is a size reduction magnification (m≦1) in the use of a reduced-size projection exposer.

According to a further aspect of the invention, there is provided an exposure mask adapted particularly for use in producing a diffraction grating.

According to a still further aspect of the invention, there is provided an exposure mask wherein thick phase shifting films composed of a material transparent to the wavelength of exposure light and serving to cause a desired phase shift are formed of an isolated pattern.

The above and other features of the present invention will become apparent from the following description which will be given with reference to the illustrative accompanying drawings.

DESCRIPTION OF THE PREFERRED EMBODIMENTS

Hereinafter the structure of the individual inventions in the present application will be described with reference to an example shown in FIG. 1A.

Figure 1A:
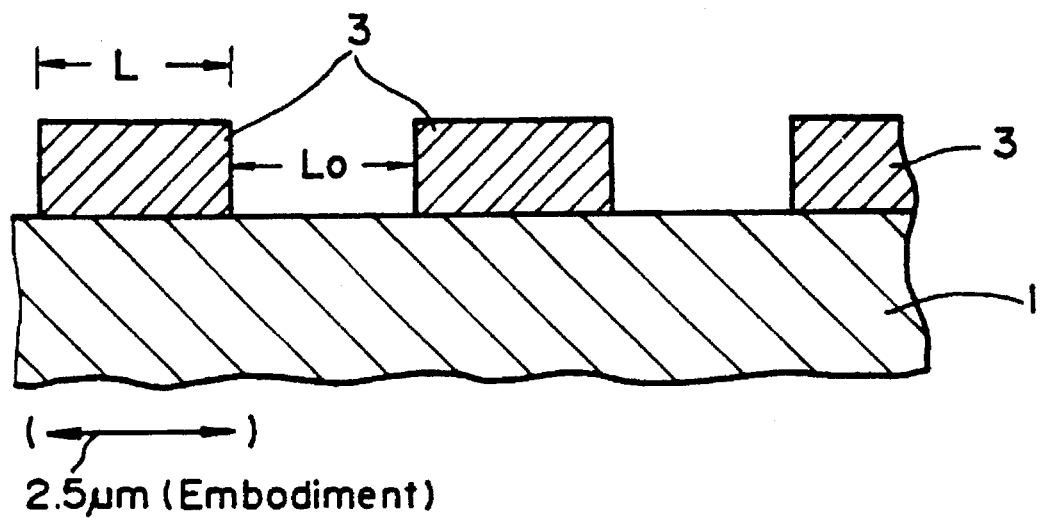
FIG. 1A shows the structure of an exposure mask in a first embodiment to explain the fundamental constitution of each invention in the present application.

In the exposure mask of each form or embodiment of the invention according to the present application, phase shifting films 3 of a transparent material are formed on a transparent substrate 1, as illustrated in FIG. 1A. (In this specification, "transparent" signifies "permeable with respect to the wavelength of exposure light employed".) The phase shifting film 3 is composed of a transparent material so as to have a thickness adequate for causing a desired phase shift. The material and the thickness of the film may be so determined selectively as to attain a phase inversion of 180° or any desired amount of phase shift such as 90° or 270° in conformity with each design. For example, in a preferred embodiment of the present invention, the film thickness d is so determined as $$d = \frac{\lambda}{2(n-1)}$$

for achieving a phase shift of 180°. In the above equation, n denotes the refractive index of the phase shifting film 3 and is therefore determined by the material of the film; and λ denotes the exposure light wavelength which is determined by the exposure light employed.

Each form or embodiment of the invention in this application has been developed on the basis of the discovery by the present inventors that the intensity of the transmitted light is basically diminished to zero or an extremely small value at the edge of the phase shifting film composed of a transparent material, i.e., at the boundary between the region where the phase shifting film is formed and any other region where such film is not existent.

Figures 1, 1B:
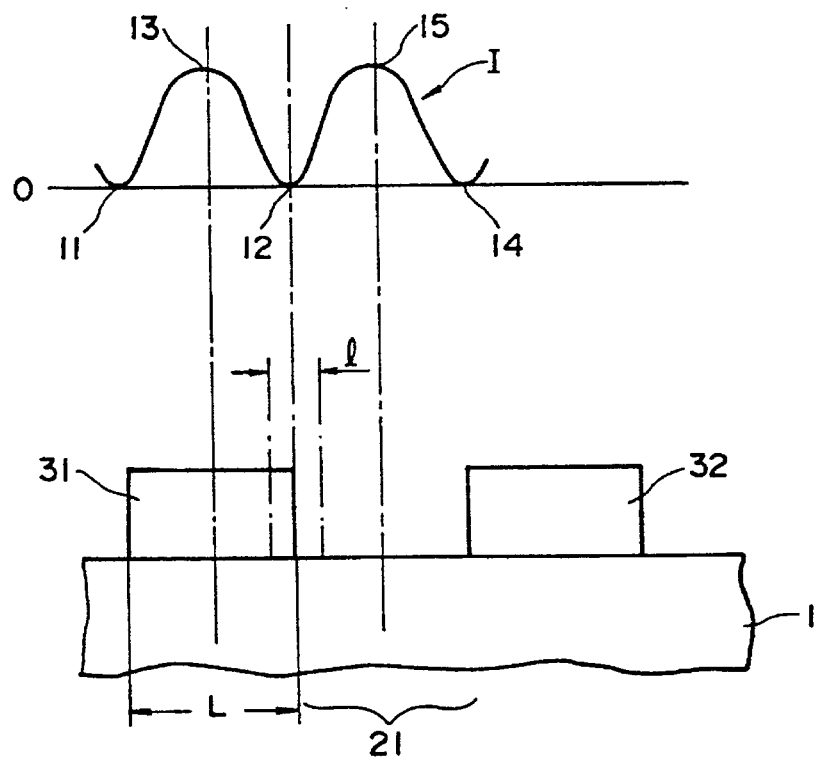
FIG. 1B illustrates the function of the present invention, in which (a) corresponds to a first embodiment of the invention and (b) corresponds to a second embodiment of the invention.
Figures 1, 1B, 2:
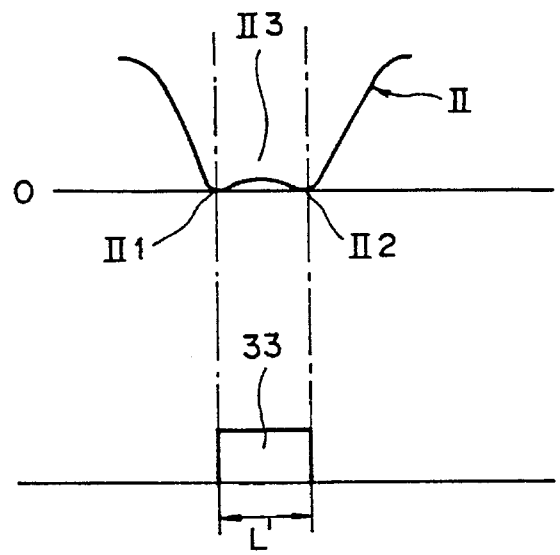
Figure 3:
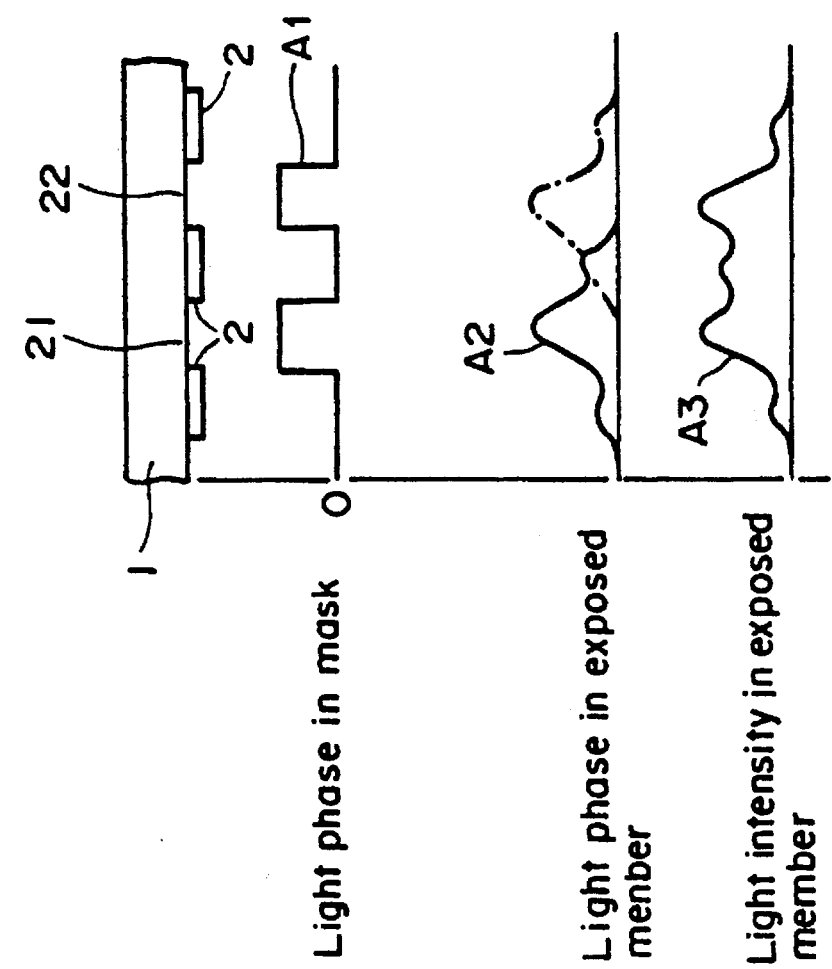
FIG. 3 (a) and (b) illustrate the principle of a phase shifting exposure mask.

In an exemplary case where phase shifting films 31, 32 are formed on a substrate 1 as illustrated in FIG. 1B (a), a reference sign I represents the intensity distribution of light irradiated through such exposure mask to a work member to be exposed. Viewing now the phase shifting film 31, for example the light intensity distribution I at the two edges of the phase shifting film 31, the intensity is diminished to zero (or a value approximate thereto) as represented by reference numerals 11 and 12. Meanwhile in the central region of the phase shifting film 31, the light is sufficiently transmitted therethrough to indicate an intensity represented by a curve 13. A similar light intensity distribution is obtained with respect to the other phase shifting film 32 also, and the intensity is remarkably low in the vicinity of the boundary (edge) as represented by a curve 14. Since the light is permitted to pass completely through a region 21 between the two phase shifting films 31 and 32, the light intensity is rendered high as represented by a curve 15.

As is apparent from the above description, the light intensity can be diminished to zero (or approximately to zero) at the edges of the phase shifting films 31 and 32 (i.e., at the boundary between the regions of the phase shifting films 31, 32 and the other region 21) without provision of any particular light shielding portion. Each invention in this application has been accomplished by the studies and examination based on such discovery. The dimensions of the region 1 (non-exposed substantially and shielded from the light) in the vicinity of the boundary where the light intensity is extremely low are dependent on both the material and the light for exposure, and can therefore be determined by a proper design.

The function described above is concerned with an exemplary case where the phase shifting mask 31 has a sufficiently great horizontal width L on the substrate. When the width L is sufficiently great, it becomes possible to obtain, also in the central regions of the phase shifting masks 31 and 32, maximal light portions 13 and 15 where the light intensity is high.

Meanwhile, FIG. 1B (b) shows another phase shifting mask 33 having a small width L'. In this example also, there are existent portions Π 1 and Π 2 where, in the vicinity of the boundary, the light intensity is diminished to zero or a value approximate thereto. However, due to the small width, the light intensity is not rendered high even in the central region of the phase shifting mask 33 because the light is not permitted to pass therethrough, and the light intensity is substantially low as represented by a curve Π 3. As a result, the behavior of the entire phase shifting mask 33 becomes the same as in a case where a light shielding portion is provided thereon.

The invention performs such function, wherein a phase shifting film is formed of an isolated pattern to achieve the known effect attained by a light shielding portion in the conventional mask.

In the invention, the width L' needs to be decreased to a certain extent when the exposure mask formed of an isolated pattern is to be utilized as a light shielding portion. In this case, the extent of such dimensional decrease must be considered to vary in a wide range depending on the various conditions. Generally, if the width on the work member to be exposed is about twice the wavelength $\lambda$ of the exposure light employed, the behavior becomes such as shown in FIG. 1B (a) in most cases. It is therefore preferred that the width be smaller than twice the wavelength, more preferably less than 1.5 times. In any exposure using a reduced-size projector, the reduction rate needs to be taken into consideration. For example, in the case of ⅕ reduction (×0.2) or a reduction magnification m=0.2, it is preferred that the width L' be set to less than 2/0.2 or 10 times, and more preferably to less than 1.5/0.2 or 7.5 times. In this specification, the size reduction magnification is expressed by a value smaller than 1.

Figure 4:
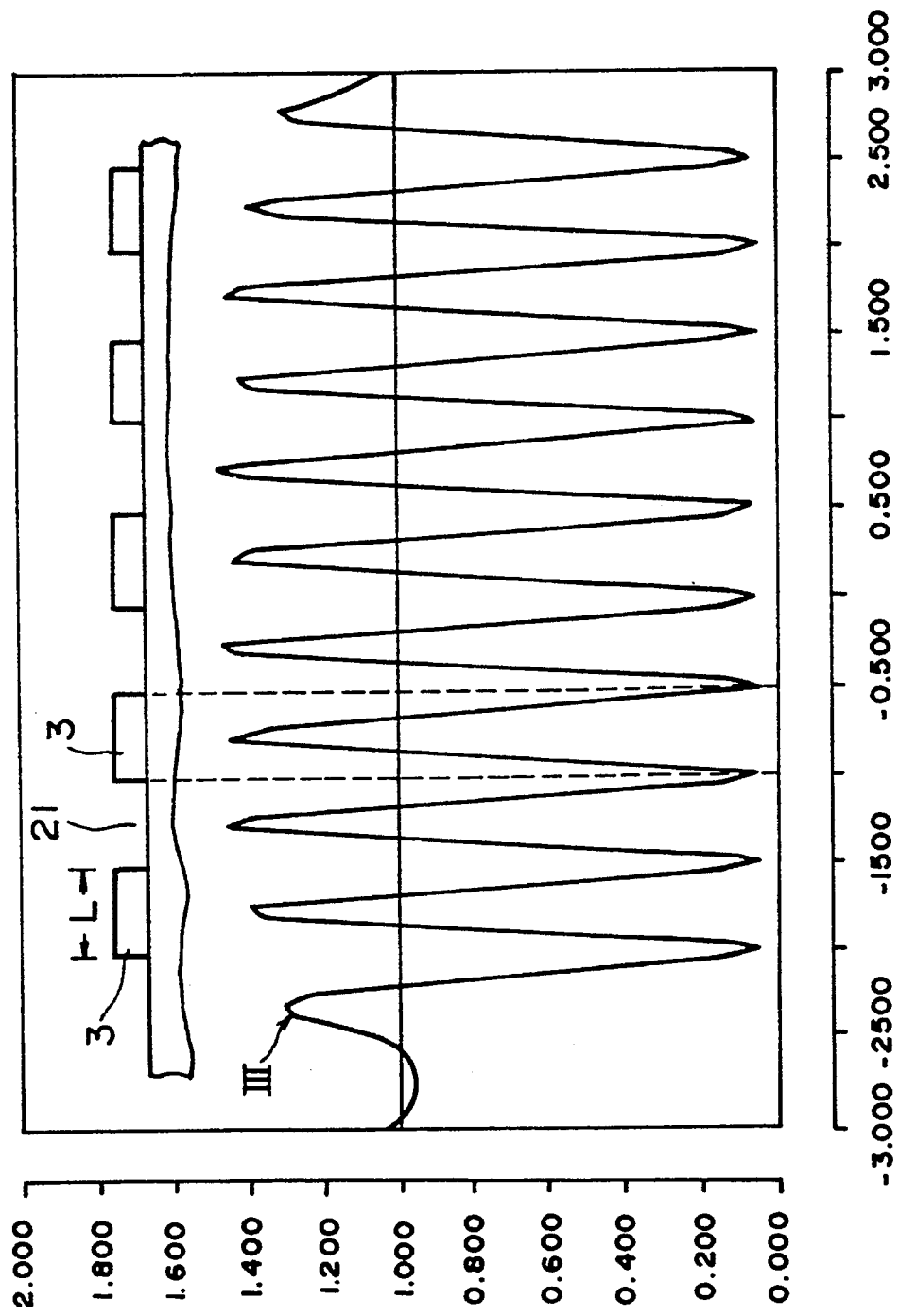
FIGS. 4 and 5 graphically show the light intensity distribution on a work member to be exposed in the first embodiment and that in the conventional example, respectively.

Now a further detailed description will be given below with regard to a first embodiment of the invention. In this invention, a phase shifting film 3 is formed principally of an arrangement of repeated patterns. In a simplest example, the exposure pattern may be formed of a line-and-space arrangement as shown in FIG. 1 or FIG. 4 which will be described later.

In this invention, "an arrangement formed principally of repeated patterns" signifies a design whose main area is composed of repeated patterns where the functional effect of the invention is rendered most conspicuous. Accordingly, if there is a mask region where none of such repeated patterns is existent, the mask is connoted in this invention unless such non-existence impairs the functional effect thereof in the repeated patterns.

In the first embodiment of the invention, it is preferred that the rule width L of the repeated pattern be set to 2 L/m (where m denotes the dimensional reduction magnification in projection when using a reduced-size work member to be exposed, in which m≦1). Due to such selective setting of the rule width, the light shielding effect can be fully achieved at the edge of the exposure mask while being also utilized for forming a remarkably fine pattern. It is adequately applicable to formation of a diffraction grating since the effect of the invention is attainable with facility in a diffraction grating which can be formed of simple repeated line-and-space patterns.

As described above, each form or embodiment of the invention in the present application is based on the principle that, when a phase shift is induced at the edge (boundary) of the phase shifting film and particularly when the phase is inverted from 0° to 180°, there is obtained a portion where the light intensity becomes zero despite non-existence of any original light shielding portion. The invention in this application is so contrived as to positively utilize such a phenomenon. In the first embodiment of the invention, the width L of the exposure mask is set to a certain large dimension for enabling a single phase shifting mask to serve as both a light shielding portion at its each end and as a light transmitting portion at its center. Meanwhile the second embodiment of the invention is so devised that the width L' of a phase shifting mask is set to a small dimension, and the entirety of the exposure mask is utilized as a light shielding portion. In each of such inventions, there is attainable a functional effect of eliminating the intricate mask positioning step required heretofore in forming both a light shileding portion and a phase shifting mask, while maintaining the advantage that realizes a fine treatment with a phase shift.

Hereinafter, a preferred embodiment of the present invention will be described. It is a matter of course that the present invention is not limited to the following embodiments alone, and a variety of changes and modifications may be made as well.

FIRST EMBODIMENT

This embodiment is adapted particularly for an exposure mask to be used in the manufacture of a semiconductor integrated circuit where a fine pattern needs to be formed.

In the exposure mask of the first embodiment, as shown in FIG. 1A, a phase shifting film 3 is formed on a substrate 1 of quartz or the like which is transparent to exposure light, without any light shielding portion of chromium or the like. In this embodiment, the exposure mask is produced by an EB (electron beam) plotting method. More specifically, the substrate 1 is coated by rotation with a negative type EB resist, and then a line-and-space pattern is plotted by means of an EB exposer. And after subsequent development, the mask obtained is used for exposure to form a pattern of a semiconductor integrated circuit. Since the required steps are merely the above, there is no necessity of executing an intricate combined exposure with positional coincidence.

More specifically, in the first embodiment, a quartz substrate 1 having a conductive film (composed of tin oxide or the like transparent to the wavelength of exposure light) was coated by rotation with a negative type EB resist (e.g., OEBR-100 made by Tokyo Applied Chemical Co., Ltd.). And after a drying step, an arrangement of repeated line-and-space patterns was produced in a width of 2.5 microns by the use of an EB exposer (e.g., MEBES made by Perkin Elmer Corporation).

Subsequently, an actual semiconductor integrated circuit was patterned by using the exposure mask of the present invention thus obtained.

A silicon wafer as a work member to be exposed was patterned in practice by a reduced-size projection exposer (size reduction rate 1:5, i.e., reduction magnification m=×0.2, NA=0.42) equipped with a KrF eximer laser (wavelength $\lambda$=250 nm). The silicon wafer (5 inches in length) dehydrated and baked at 200° C. for one minute was treated with hexamethyl disilazane vapor at room temperature for one minute. Thereafter it was coated by rotation with a positive type resist PR1024MB (made by Toray McDermid Corporation) in such a manner as to obtain a film thickness of 0.5 micron, and then was soft-baked. Subsequently an exposure was executed thereto by an amount of 250 mJ/cm² with the above-described exposure mask. And finally it was paddle-developed for two minutes with an exclusive liquid developer (TRD-50-51). By observation with an optical microscope after such development, there was confirmed a line-and-space pattern having a rule width of 0.25 micron.

FIG. 4 graphically shows the intensity distribution III of the light irradiated to the work member to be exposed (such as semiconductor wafer) through the exposure mask of the first embodiment. As shown, both ends of each phase shifting portion 3 serve as light shielding portions where the light intensity is approximately zero. Meanwhile the center of each region 21 between the mutually adjacent phase shifting films 3 serves as a light transmitting portion.

Figure 2:
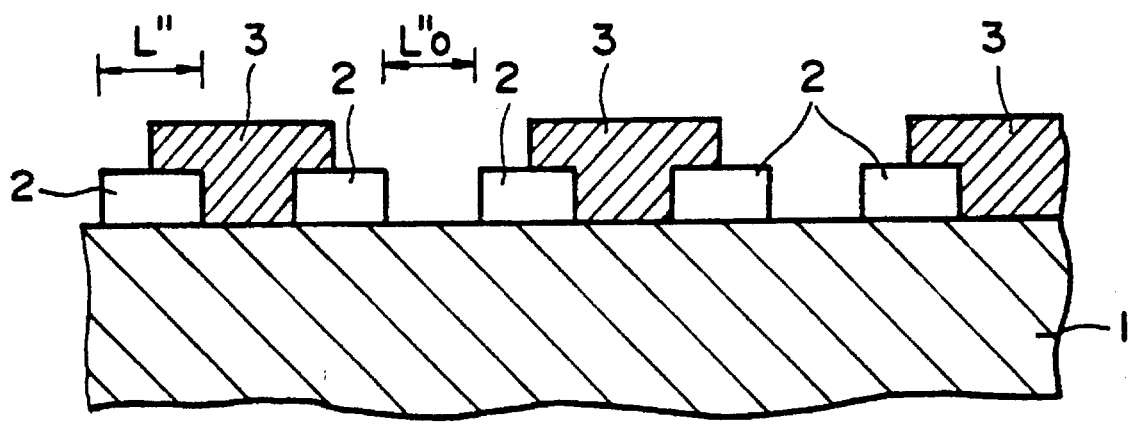
FIG. 2 shows the structure of a conventional phase shifting exposure mask.

In contrast therewith, a phase shifting exposure mask of the conventional structure shown in FIG. 2 was produced as a comparative example and was used for patterning. More specifically, a quartz substrate 1 having a conductive film of chromium was so patterned by the ordinary method as to form repeated line-and-space patterns of 1.25 micron to obtain light shielding portions 2 of chromium, and then phase shifting films 3 were formed with a mask positioning step in such a manner that one phase shifting film 3 was existent in every other space between the light shielding portions 2. Using the phase shifting exposure mask thus obtained as a comparative example, patterning was performed in the same manner as in the use of the exposure mask according to the present invention. However, there was observed extremely great wear in the film of the 0.25-micron line-and-space pattern, so that it consequently failed in meeting the practical requirements.

Figure 5:
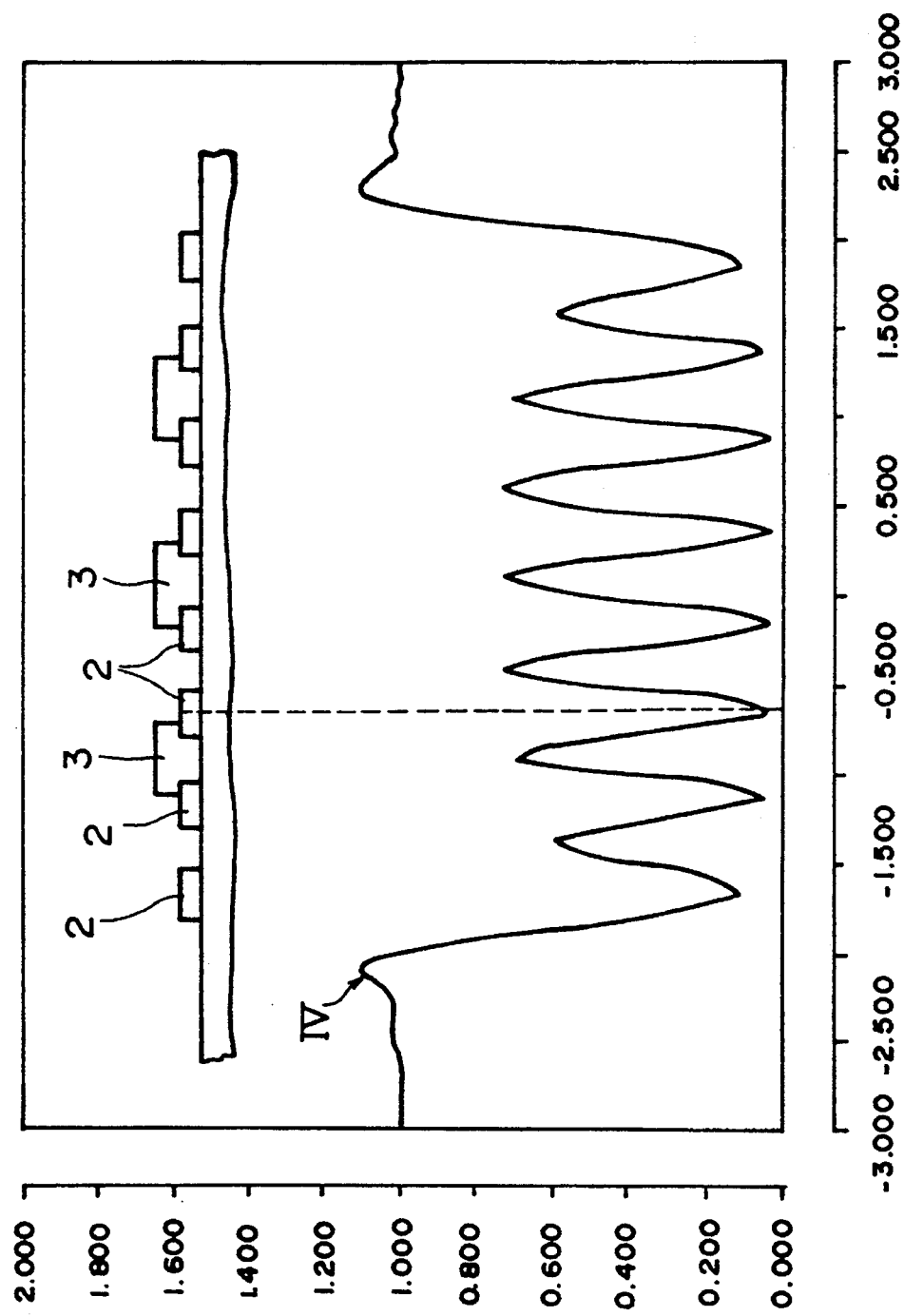

FIG. 5 graphically shows the intensity distribution IV of the light irradiated through the comparative exposure mask to the work member to be exposed. It is apparent from a comparison of FIGS. 4 and 5 that, in contrast with the conventional example where one light shielding portion is required for obtaining one non-exposed portion, the present invention is capable of providing two non-exposed portions by one phase shifting film, so that the dimensions can be doubled by the application of this invention to ensure a dimensional allowance with another advantage of achieving a further finer pattern.

When forming a 0.25-micron line-and-space pattern in the exposure mask of the present invention, both the width L of the phase shifting film 3 and the width $L_0$ of the space between the mutually adjacent phase shifting films may be set to 2.5 microns respectively as illustrated in FIG. 1A. However, in the conventional phase shifting mask, its specific dimensions are such that, as shown in FIG. 2, the width L" of the light shielding portion 2 and the width $L_0$" of the space between the mutually adjacent light shielding portions are both 1.25 micron to require half-width processing. (In this example, the size reduction magnification m is supposed to be 0.2.)

According to the exposure mask of the present invention, in comparison with the conventional phase shifting mask produced as a comparative example by the known method, there are attainable some advantages including elimination of the intricate positioning step during the manufacture and a greater dimensional allowance which is twice the known value to consequently facilitate the manufacture. Besides the above, the light intensity difference between the light and dark portions is great (as shown in FIG. 4), and remarkable effects are achievable particularly in an arrangement of repeated line-and-space patterns.

Thus, in the first embodiment mentioned, the requisite is merely to form, on the exposure mask, a pattern having double the size of a desired pattern on the work member to be exposed, because portions to render the light intensity zero are produced at both edges of the pattern of the phase shifting films.

In the first embodiment, an EB resist was directly used as a material for forming the phase shifting film. And the film thickness d was selectively set to a value which is adequate for causing a phase inversion (180°) and which is determined by the refractive index n of the material and the wavelength λ of the exposure light.

In this embodiment, the phase shift was selected to be 180° for causing a phase inversion. However, since the light intensity can be diminished to zero even with a 90° shift instead of such 180°, any adequate value may be set to cause a desired phase shift.

Although in this embodiment the phase shifting film was formed with facility by the direct use of an EB resist, the process is not limited to such example alone, and the exposure mask can be produced by previously forming a phase shifting film or an etching stopper film on the substrate 1 of quartz or the like. In such a modification, an adequate material for the phase shifting film may be selected from silicon dioxide, silicon oxide and silicon nitride. In this case, a desired exposure mask can be manufactured by first forming such films sequentially, then patterning the same in accordance with each design as mentioned, subsequently etching the phase shifting film and removing the EB resist. And an exposure may be executed by the use of such a mask as thus obtained.

According to this embodiment, it becomes possible to eliminate the known processing intricacy in the conventional manufacture of a phase shifting exposure mask and also to obtain an improved mask where the maximum resolution and the focusing allowance are increased merely by a single exposure. And it is further possible to realize formation of a pattern finer than the threshold resolution.

SECOND EMBODIMENT

This embodiment is concerned with a case of employing the exposure mask of the present invention for production of a diffraction grating. This invention was utilized particularly for producing a diffraction grating of a DFB (distribution feedback type) laser diode.

Figure 6:
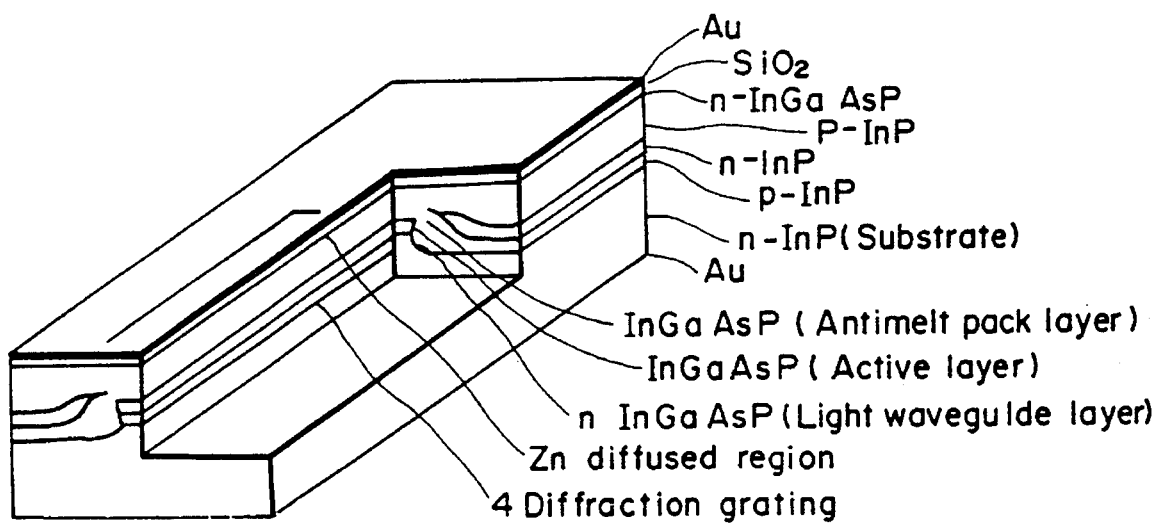
FIG. 6 shows the structure of a DFB laser in a second embodiment.

FIG. 6 illustrates an exemplary structure of a DFB laser, wherein reference numeral 4 denotes a diffraction grating. The diffraction grating used in a DFB laser is formed of repeated patterns as schematically illustrated in FIG. 7, so that the exposure mask of this invention is effectively utilizable therefor.

Figure 7:
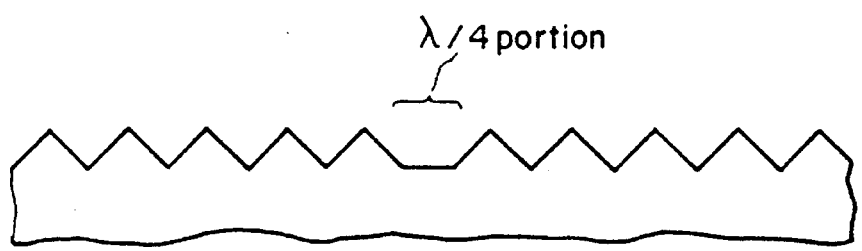
FIG. 7 is a sectional view schematically showing the structure of a diffraction grating.

In FIG. 7, a portion denoted by λ/4 is a non-repeated pattern region. Despite the existence of such non-repeated pattern region, the effect of the invention is not impaired at all as described already.

THIRD EMBODIMENT

Figure 8A:
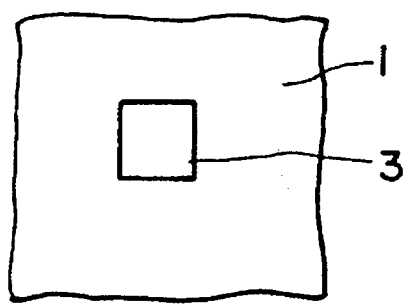
FIGS. 8 and 9 illustrate exposure masks of an isolated pattern type, in which (a) represents an exposure mask in a third embodiment, and (b) represents a conventional exposure mask.
Figure 8B:
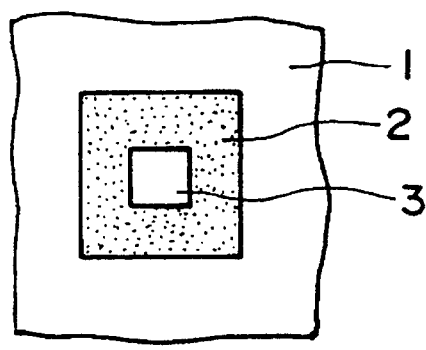

This embodiment is concerned with an exemplary case of applying the invention to an exposure mask adapted for forming an isolated pattern. In this embodiment, as illustrated in FIG. 8 (a) and 9 (a), a phase shifting film 3 is formed of an isolated pattern on a substrate 1 in a manner to function as a light shielding portion. There is thus produced an exposure mask usable for forming an isolated pattern on a work member to be exposed.

Figure 9A:
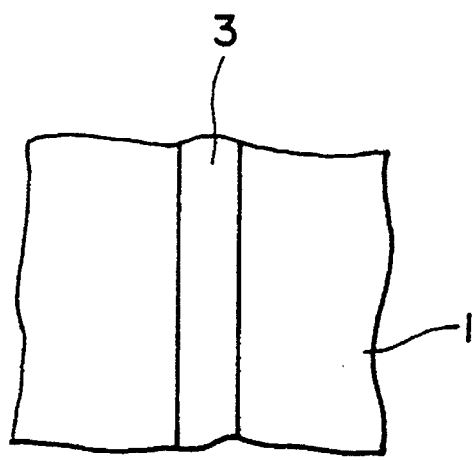
Figure 9B:
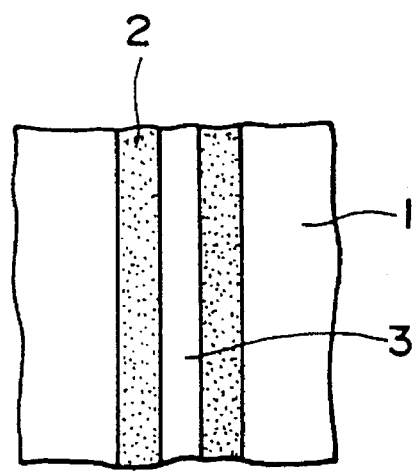

FIG. 8 (a) illustrates an exposure mask where a phase shifting film 3 of an isolated hole pattern is provided on a substrate 1 so as to form a contact hole. And FIG. 9 (a) illustrates an exposure mask where a phase shifting film 3 of an isolated line pattern is provided on a substrate 1 so as to form an isolated line.

It has been necessary in the prior art heretofore that, as shown in FIGS. 8 (b) and 9 (b), a central aperture is formed in a light shielding portion 2 composed of a light shielding material such as chromium, and a phase shifting portion 3 is formed therein for causing a phase difference. Therefore, in the conventional technique, at least two steps are needed to form the light shielding portion 2 and the phase shifting portion 3. Furthermore, due to the existence of the central aperture, the light shielding portion 2 is divided into two to consequently narrow the line width, hence bringing about difficulty in complete plotting of a fine pattern. In contrast therewith, this embodiment is so contrived that a phase shifting portion 3 is formed of an isolated pattern without any light shielding portion, and the phase of the light transmitted therethrough is changed in comparison with that in any other portion of the mask, whereby such phase shifting portion is enabled to serve as a light shielding portion. Thus, the resolution attained by the phase shifting method can be enhanced with another advantage of simplifying the mask manufacturing process.

Figure 10A:
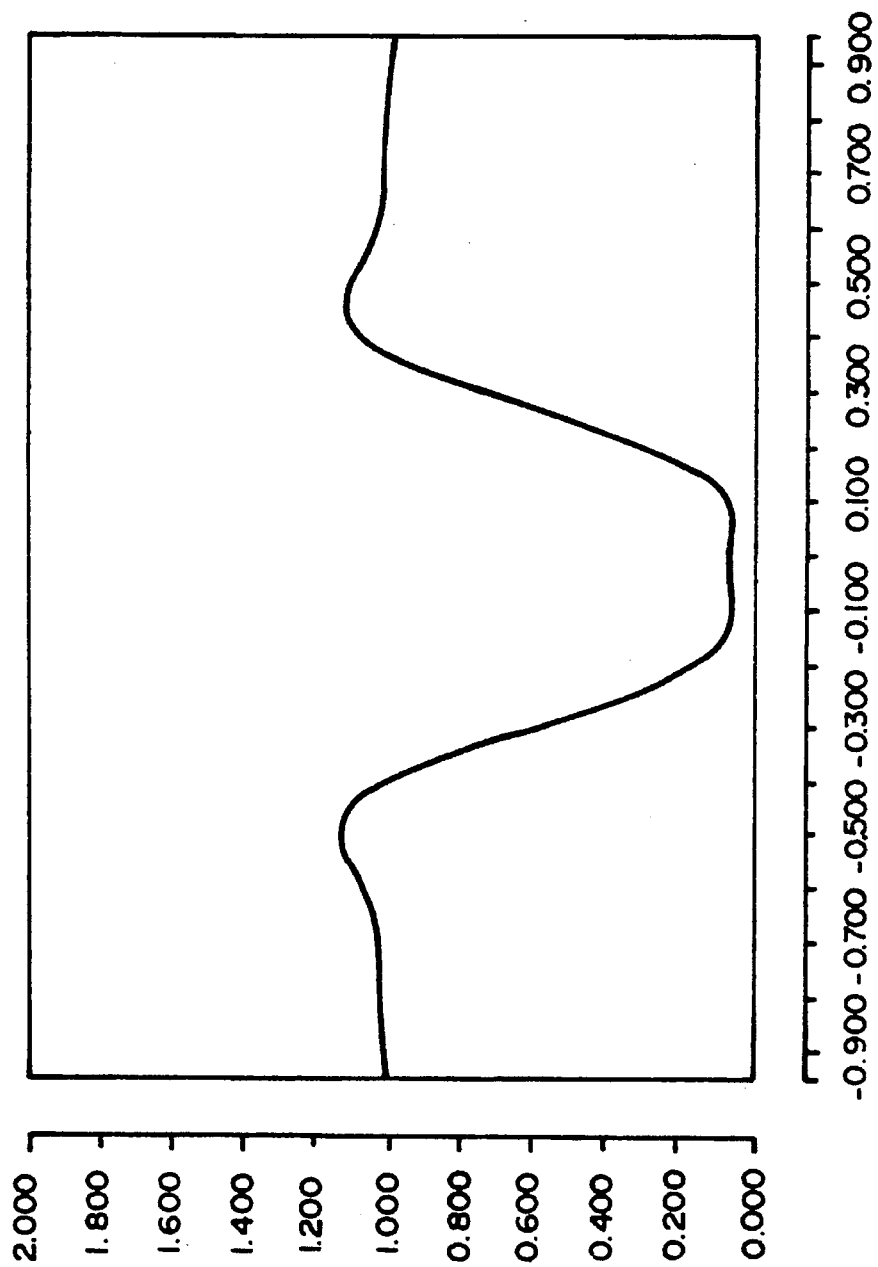
FIG. 10 (a) and (b) graphically show the light intensity distributions in the exposure masks of FIG. 8 (a) and (b) respectively.
Figure 11A:
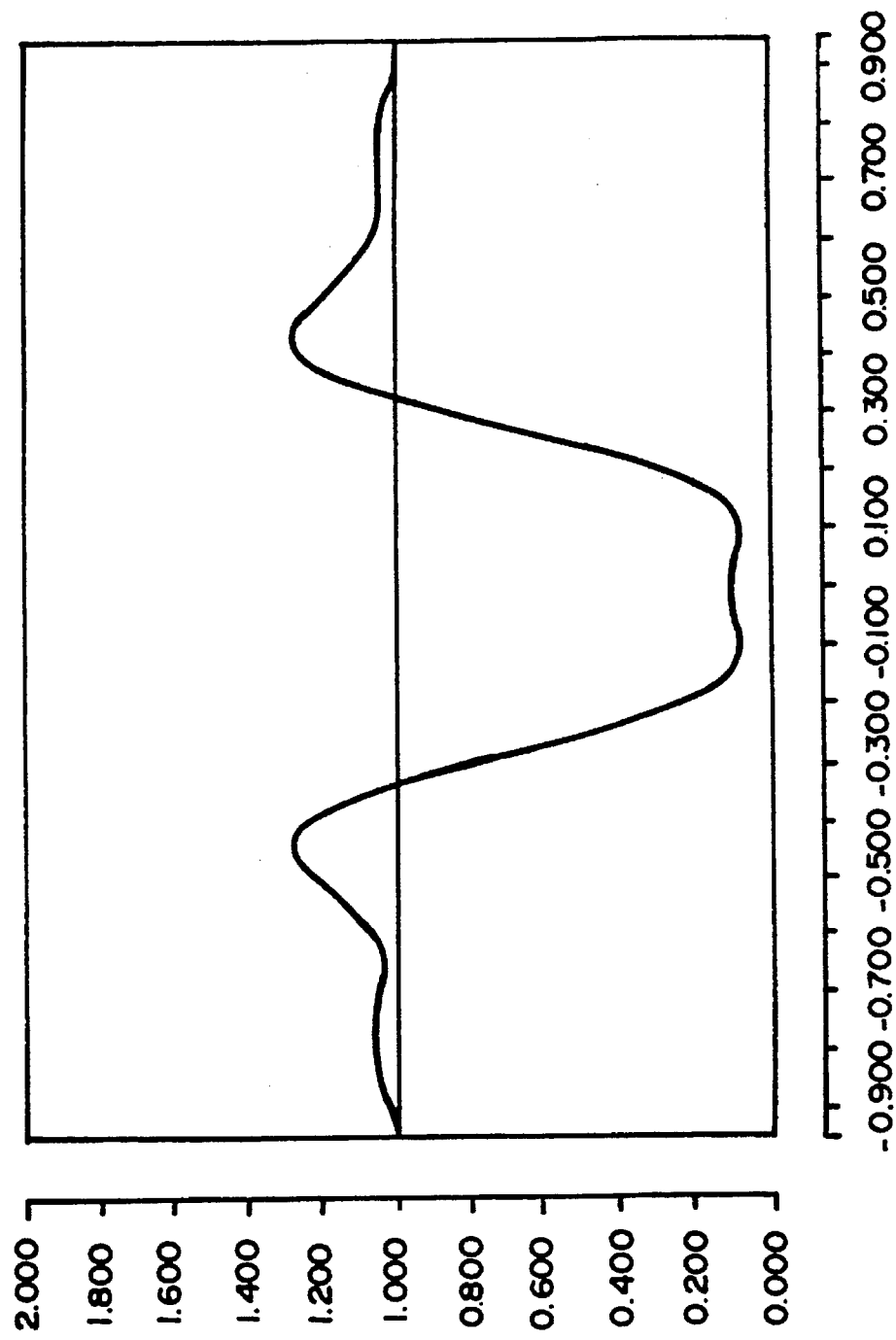
FIG. 11 (a) and (b) graphically show the light intensity distributions in the exposure masks of FIG. 9 (a) and (b) respectively.
Figure 11B:
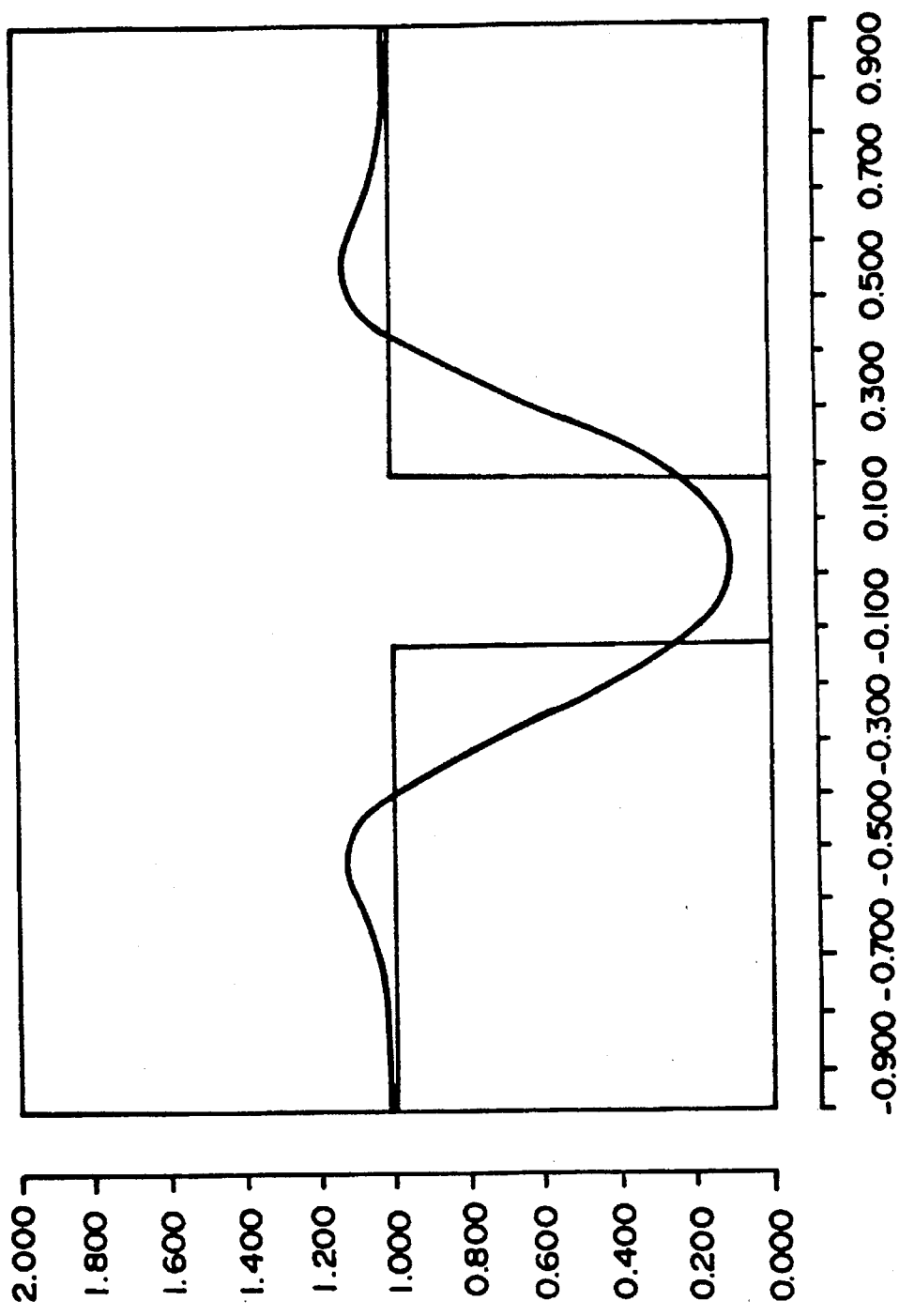

For confirming the function of the exposure mask of the third embodiment shown in FIGS. 8 (a) and 9 (a), it was compared with the conventional exposure mask shown in FIGS. 8 (b) and 9 (b) with regard to the respective light intensity distributions indicated in transferring the pattern by the use of a KrF eximer laser. The results obtained by calculating such distributions are graphically shown in FIG. 10 (a) and (b) relative to the contact-hole type mask of FIG. 8 (a) and (b), and also in FIG. 11 (a) and (b) relative to the isolated-line type mask of FIG. 9 (a) and (b). It is obvious therefrom that, with respect to both types, the intensity distribution can be improved in the third embodiment with enhancement of the resolution.

According to this embodiment, the operation of patterning a phase shifting exposure mask can be performed in a single step with another advantage that the resolution is enhanced by applying the phase shifting method to an extremely fine pattern.

With the third embodiment, described in connection with FIG. 1B (b), it is necessary to decrease the pattern width to a certain extent. This embodiment is so designed that, at a 1:1 conversion irrespective of any size reduction, the dimension on the work member to be exposed becomes less than 1.5 $\lambda$ where $\lambda$ is the wavelength of the exposure light.

Figure 12:
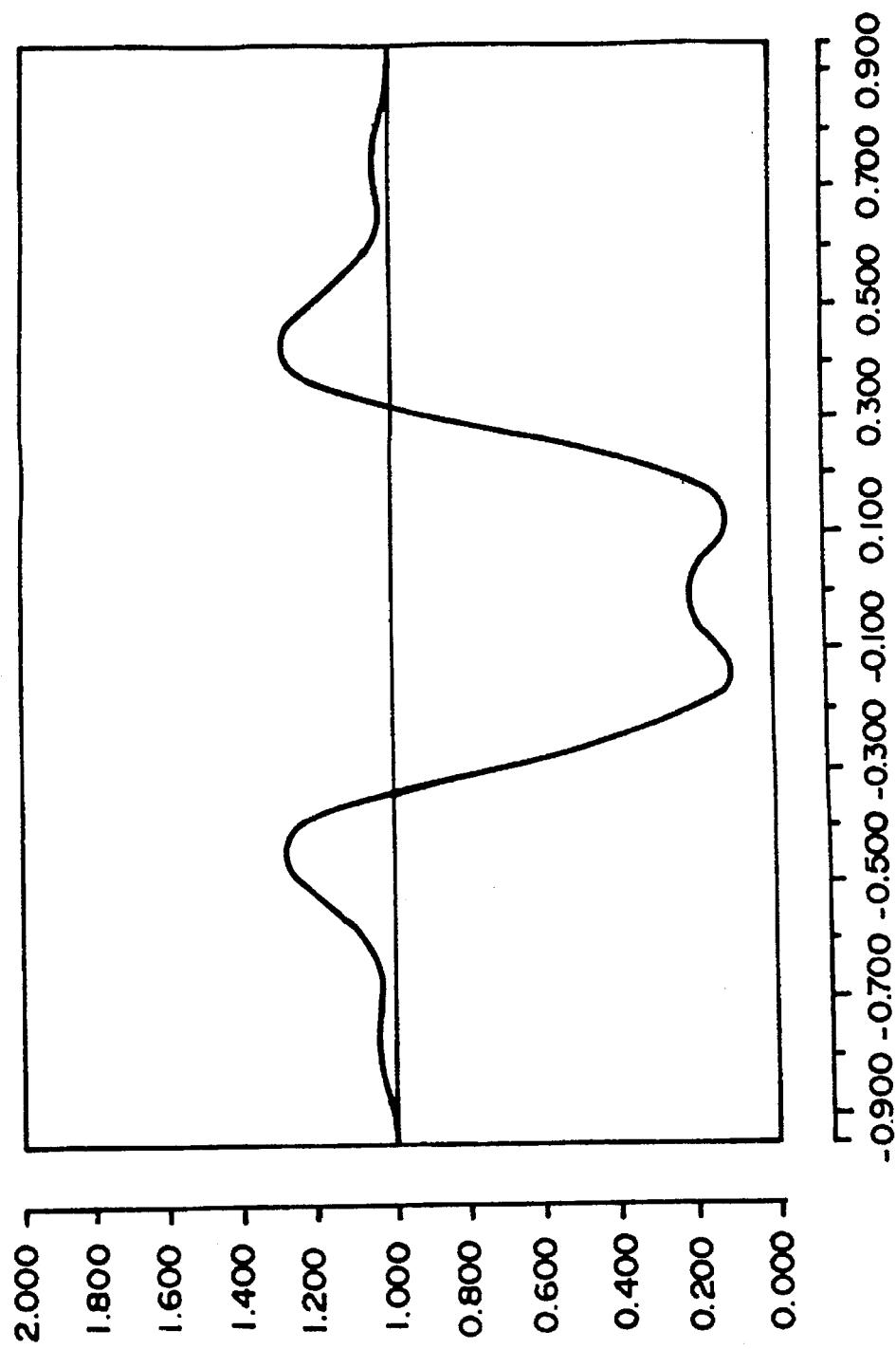
FIG. 12 graphically shows the light intensity distribution obtained in an exemplary case where the line width of an isolated pattern is set to an increased dimension.

As graphically shown in FIG. 12, the light intensity in the central region of the phase shifting film tends to be higher in accordance with increase of the pattern width. It is therefore necessary to take such tendency into consideration so as to avert an impediment.

According to the inventions of the present application, as described hereinabove, it becomes possible to provide an improved exposure mask which is easily manufacturable without the necessity of any intricate process such as a positioned exposure, hence minimizing the number of required steps in manufacture while achieving further fine work with an enhanced resolution higher than the known value.

What is claimed is:

1. An exposure mask having phase shifting films of a predetermined thickness composed of a material transparent to a wavelength of exposure light and formed on a substrate transparent to said wavelength for causing a desired phase shift, wherein said phase shifting films are so patterned as to have an arrangement of principally repeated patterns on said substrate without any separate light shielding members therebetween since said transparent film patterns themselves provide periodic light shielding through phase difference light interference.

2. An exposure mask according to claim 1, wherein, relative to a rule width L of said repeated patterns projected onto a work member to be exposed, a pattern having a rule width of 2 L/m is formed, in which m is a size reduction magnification (m≦1) in the use of a reduced-size projection exposer.

3. An exposure mask according to claim 2 wherein said mask is adapted for use in producing a diffraction grating.

4. An exposure mask according to claim 1 wherein said mask is adapted for use in producing a diffraction grating.

5. An exposure mask having phase shifting films of a predetermined thickness composed of a material transparent to the wavelength of exposure light and formed on a substrate transparent to such wavelength for causing a desired phase shift, wherein said phase shifting films are formed of an isolated pattern.

6. An exposure mask having phase shifting films of a predetermined thickness composed of a material transparent to a wavelength of exposure light and formed on a substrate transparent to said wavelength for causing a desired phase shift, wherein said phase shifting films are so patterned as to have an arrangement of principally repeated patterns without separate light shielding members therebetween, and wherein the pattern phase shifting films are designed so that light intensity projected onto an exposed member and passing through the exposure mask is relatively high opposite each of the patterns and between the patterns, and is relatively low opposite pattern edges.

7. A mask according to claim 6 wherein a rule width L of said repeated patterns is chosen sufficiently great so that the light intensity is relatively high opposite each of the patterns and also between each of the patterns.

8. An exposure mask having phase shifting films of a predetermined thickness composed of a material transparent to a wavelength of exposure light and formed on a substrate transparent to said wavelength for causing a desired phase shift, said phase shifting films being so patterned as to have an arrangement of principally repeated patterns, and the patterns being designed such that light intensity projected onto an exposed surface passing between each of the patterns is relatively high whereas light intensity projected onto the exposed surface and passing through each of the patterns is relatively low.

9. A mask according to claim 8 wherein a rule L' of each of the repeated patterns is chosen sufficiently small so that the light intensity passing through each of the patterns and projected onto the exposed surface is relatively low.

\* \* \* \* \*